(12) United States Patent
Ueda

(10) Patent No.: US 6,399,518 B1
(45) Date of Patent: Jun. 4, 2002

(54) RESIST COATING AND DEVELOPING PROCESSING APPARATUS

(75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/576,889

(22) Filed: May 24, 2000

(30) Foreign Application Priority Data

May 25, 1999 (JP) .......................................... 11-144661

(51) Int. Cl.[7] .............................................. H01C 21/31
(52) U.S. Cl. .................. 438/758; 118/53; 118/302; 118/314; 427/240; 427/335; 427/377
(58) Field of Search ........................ 438/758; 118/302, 118/314, 53; 427/240, 335, 377, 385.5, 422; 454/187, 217, 222

(56) References Cited

U.S. PATENT DOCUMENTS

| | | | |
|---|---|---|---|
| 5,571,560 A | * 11/1996 | Lin | 427/240 |
| 5,876,280 A | 3/1999 | Kitano et al. | 454/187 |

FOREIGN PATENT DOCUMENTS

| | | |
|---|---|---|
| JP | 02-001113 A | 1/1990 |
| JP | 11-003850 | 1/1999 |

\* cited by examiner

Primary Examiner—David Nelms
Assistant Examiner—Reneé R Berry
(74) Attorney, Agent, or Firm—Rader, Fishman & Grauer, PLLC

(57) ABSTRACT

A resist coating and developing processing apparatus comprises an airflow forming mechanism for forming airflows from the tops of a cassette station, a processing station, and an interface section toward the bottoms and a controller for controlling the airflow forming mechanism, in which the processing station includes draft openings communicating with the cassette station and the interface section respectively. The controller controls the airflow forming mechanism so that the pressure in the processing station becomes higher than the pressures in the cassette station and the interface section to form flows of air from the processing station into the cassette station and the interface section. Thereby, influence of impurity components such as particles, alkaline components, and the like and changes in atmosphere such as temperature, humidity, and the like exerted on processing can be effectively precluded.

19 Claims, 9 Drawing Sheets

|  | TEMPERATURE | HUMIDITY | CONTAMINATION | AMMONIA CONCENTRATION |
|---|---|---|---|---|
| CASSETTE STATION | CLEAN ROOM TEMPERATURE (UNMANAGED) | CLEAN ROOM HUMIDITY (UNMANAGED) | MANAGED | UNMANAGED |
| PROCESSING STATION (SPINNER TYPE) | SET TEMPERATURE | SET HUMIDITY | MANAGED | MANAGED (1 ppb OR LESS) |
| PROCESSING STATION (OTHER THAN TYPE ABOVE) | CLEAN ROOM TEMPERATURE (UNMANAGED) | CLEAN ROOM HUMIDITY (UNMANAGED) | MANAGED | MANAGED (1 ppb OR LESS) |
| INTERFACE SECTION | CLEAN ROOM TEMPERATURE (UNMANAGED) | CLEAN ROOM HUMIDITY (UNMANAGED) | MANAGED | MANAGED (1 ppb OR LESS) |
| ALIGNER | SET TEMPERATURE (HIGH PRECISION) | SET HUMIDITY | MANAGED | MANAGED (1 ppb OR LESS) |

FIG.7

RESIST COATING AND DEVELOPING PROCESSING APPARATUS

BACKGROUND OF THE INVENTION

1. Field of the Invention

The present invention relates to a resist coating and developing processing apparatus for coating a substrate such as a semiconductor wafer and the like with a resist solution to form a resist film and for performing developing processing for the resist film on the substrate after exposure by an aligner.

2. Description of the Related Art

In a photolithography process of a semiconductor device, a semiconductor wafer is coated with a resist, a resist film formed by the coating is exposed in accordance with a predetermined circuit pattern, and the exposed pattern is developed, whereby a circuit pattern is formed on the resist film.

To perform such a series of processes, conventionally a resist coating and developing processing system has been used. Such a resist coating and developing processing system comprises: a processing station in which various processing units for performing various kinds of processing for coating and development for a wafer are multi-tiered; a cassette station, in which cassettes for housing a plurality of semiconductor wafers are mounted, for carrying the semiconductor wafers into the processing station one by one and carrying the semiconductor wafer after processing out of the processing station and housing it in a cassette; and an interface section for delivering the wafer to/from an aligner, disposed adjacent to the system, for exposing a resist film in a predetermined pattern, which are integrally provided.

In such a resist coating and developing processing system, wafers are taken out of the cassettes placed in the cassette station one by one and transferred to the processing station. The wafer is first subjected to hydrophobic processing in an adhesion processing unit and cooled in a cooling processing unit, and thereafter coated with a photoresist film in a resist coating unit and subjected to baking processing in a heat processing unit.

Thereafter, the semiconductor wafer is transferred to the aligner from the processing station via the interface section and the resist film is exposed in a predetermined pattern in the aligner. After exposure, the semiconductor wafer is transferred again to the processing station via the interface section. The exposed semiconductor wafer is first subjected to post-exposure bake processing in the heat processing unit and cooled, and thereafter coated with a developing solution in a developing processing unit, whereby the exposed pattern is developed. Then, the semiconductor wafer is subjected to post-bake processing in the heat processing unit and cooled, and thus a series of processes is completed. After the completion of the series of processes, the semiconductor wafer is transferred to the cassette station and housed in a wafer cassette.

In such a resist coating and developing processing system and aligner, the pressures therein are set higher than the pressure in the clean room in which the system and aligner are placed to prevent entry of particles and the like from the outside.

Recently, with high integration of semiconductor devices, it is demanded to make patterns more minute, and a chemically amplified resist is used as a resist capable of forming such minute patterns.

However, the chemically amplified resist is highly environment-dependent and susceptible to causing poor resolution with the existence of not only particles but also of alkaline components such as ammonia and the like and presents large ununiformity in line width due to changes in temperature and humidity.

Thus, in resist coating processing, developing processing, and exposure processing, it is necessary to exclude especially particles and alkaline components such as ammonia and the like thoroughly and it is also necessary to preclude changes in temperature and humidity as much as possible. Therefore, it is not enough only to set the pressures in the resist coating and developing processing system and aligner higher than the pressure in the clean room as described above.

SUMMARY IF THE INVENTION

An object of the present invention is to provide a resist coating and developing processing apparatus capable of effectively excluding influence of impurity components such as particles, alkaline components, and the like and changes in atmosphere such as temperature, humidity, and the like on processing.

To attain the above object, a first aspect of the present invention is a resist coating and developing processing apparatus comprising: a processing section in which a plurality of processing units for performing various kinds of processing for resist-coating and developing processing for a substrate are disposed; a carrying in/out section, including a mounting portion capable of mounting a substrate housing container for housing a plurality of substrates thereon, for carrying the substrate from the substrate housing container into the processing section and for housing the substrate carried out of the processing section in the substrate housing container; an interface section for receiving the substrate from the processing section and passing it to an aligner and for receiving the substrate after exposure from the aligner and passing it to the processing section; airflow forming means for forming flows of air from the tops of the carrying in/out section, processing section, and interface section toward the bottoms; and control means for controlling the airflow forming means, the processing section including draft openings communicating with the carrying in/out section and the interface section respectively, and the control means controlling the airflow forming means so that the pressure in the processing section becomes higher than the pressures in the carrying in/out section and in the interface section to form flows of air from the processing section into the carrying in/out section and the interface section.

According to the structure as above, the airflow forming means forms airflows from the tops of the carrying in/out section, processing section, and interface section toward the bottoms, and the control means controls the airflow forming means so that the pressure in the processing section becomes higher than the pressures in the carrying in/out section and in the interface section to form flows of air from the processing section into the carrying in/out section and the interface section, thereby preventing entry of air from the carrying in/out section and the interface section into the processing section and securely preventing entry of impurities into the processing section for performing resist-coating and developing processing which loathes entry of impurities and changes in atmosphere and changes in atmosphere in the processing section.

Further in the aforesaid resist coating and developing processing apparatus, the interface section includes a communicating opening communicating with the aligner and the control means controls the airflow forming means so that the pressure in the interface section becomes lower than the pressure in the aligner to thereby form a flow of air from the aligner into the interface section, thereby preventing entry of air into the aligner from which influence of temperature needs to be excluded to obtain a precise pattern.

In this case, it is preferable that the control means controls the airflow forming means so that the pressure in the processing section becomes lower than the pressure in the aligner. Thereby, entry of air from the processing section into the aligner which loathes entry of external atmosphere can be securely prevented. In such a structure, it is preferable to provide a draft opening of the processing section communicating with the interface section at a position higher than the communicating opening of the interface section communicating with the aligner. Thereby, the airflow control can be made easier.

As for the concrete structure of the airflow forming means, one including an air supply mechanism for supplying air from the tops of the carrying in/out section, processing section, and interface section and an exhaust mechanism for exhausting air from the respective bottoms can be shown. In this case, the control means can control the pressures of the carrying in/out section, processing section, and interface section by controlling the air supply mechanism and/or the exhaust mechanism.

Moreover, the air supply mechanism can be structured to include dampers provided at air introducing ports at the respective tops of the carrying in/out section, processing section, and interface section. In this case, the control means can control the degrees of opening of the dampers to control the pressures of the carrying in/out section, processing section, and interface section.

The exhaust mechanism can be structured to include slit dampers provided at the respective bottoms of the carrying in/out section, processing section, and interface section and exhaust fans provided under the slit dampers. In this case, the control means can control the pressures of the carrying in/out section, processing section, and interface section by controlling the degrees of opening of the slit dampers and/or the numbers of revolutions of the exhaust fans.

The processing section can be structured to include further a transfer path and a transfer apparatus, moving in the transfer path, for transferring the substrate to the plurality of processing units. In this case, the exhaust mechanism can exhaust air downward from the bottom of the transfer path.

The processing section can be structured to include thermal-system processing unit group composed of a plurality of thermal-system processing units for performing thermal processing for the substrate stacked in tiers and rotary-system processing unit group composed of coating processing units and/or developing processing units for performing processing while the substrate is rotated stacked in tiers. In this case, it is preferable that the air supply mechanism supplies air to the rotary-system processing unit group, and the thermal-system processing unit group and the transfer path separately and the control means controls the air supply mechanism so that the pressure in the rotary-system processing unit group becomes higher than the pressure in the transfer path and the thermal-system processing unit group. Thereby, entry of air from the transfer path and the thermal-system processing unit group into the rotary-system processing unit group for which the most precise management is required in the processing section can be prevented and entry of impurities into the rotary-system processing units for performing resist coating and developing processing and changes in the atmosphere can be further securely prevented.

The control means can be structured to control the pressures of the carrying in/out section, processing section, and interface section based on detected values of pressure sensors for detecting the respective pressures of the carrying in/out section, processing section, and interface section.

It is preferable to include further filters respectively provided at air introducing portions of the carrying in/out section, processing section, and interface section, for cleaning air. Thereby, processing atmosphere can be cleaned more highly.

Further, it is preferable to perform one of managing temperature, or temperature and humidity of air of the processing section, managing concentrations of air contamination of the carrying in/out section, processing section, and interface section, and managing ammonia concentrations of air of the processing section and interface section.

A second aspect of the present invention is a resist coating and developing processing apparatus comprising: a processing section in which a plurality of processing units for performing various kinds of processing for resist-coating and developing processing for a substrate are disposed; a carrying in/out section, including a mounting portion capable of mounting a substrate housing container for housing a plurality of substrates thereon, for carrying the substrate from the substrate housing container into the processing section and for housing the substrate carried out of the processing section in the substrate housing container; an interface section for receiving the substrate from the processing section and passing it to an aligner and for receiving the substrate after exposure from the aligner and passing it to the processing section; airflow forming means for forming flows of air from the tops of the carrying in/out section, processing section, and interface section toward the bottoms; and control means for controlling the airflow forming means, the processing section including a first and a second draft opening communicating with the carrying in/out section and the interface section respectively, and the control means controlling the airflow forming means to form flows of air with a strength not more than a first strength from the tops of the carrying in/out section, processing section, and interface section toward the bottoms when the resist coating and developing processing apparatus is processing the substrate, and to form flows of air with a second strength which exceeds the first strength from the tops of the carrying in/out section and processing section toward the bottoms in a predetermined case.

In the present invention, flows of air are formed with the second strength which exceeds the first strength from the tops of the carrying in/out section and processing section toward the bottoms during maintenance, for example, whereby particles which form during maintenance can be forcibly excluded from the carrying in/out section and the like.

These objects and still other objects and advantages of the present invention will become apparent upon reading the following specification when taken in conjunction with the accompanying drawings.

BRIEF DESCRIPTION OF THE DRAWINGS

FIG. 7 is a table showing the nature of management such as temperature, humidity, and the like in the coating and developing processing system shown in FIG. 1;

DETAILED DESCRIPTION OF THE PREFERRED EMBODIMENT

Hereinafter, preferred embodiments of the present invention will be described in detail with reference to the accompanying drawings.

Figure 1:
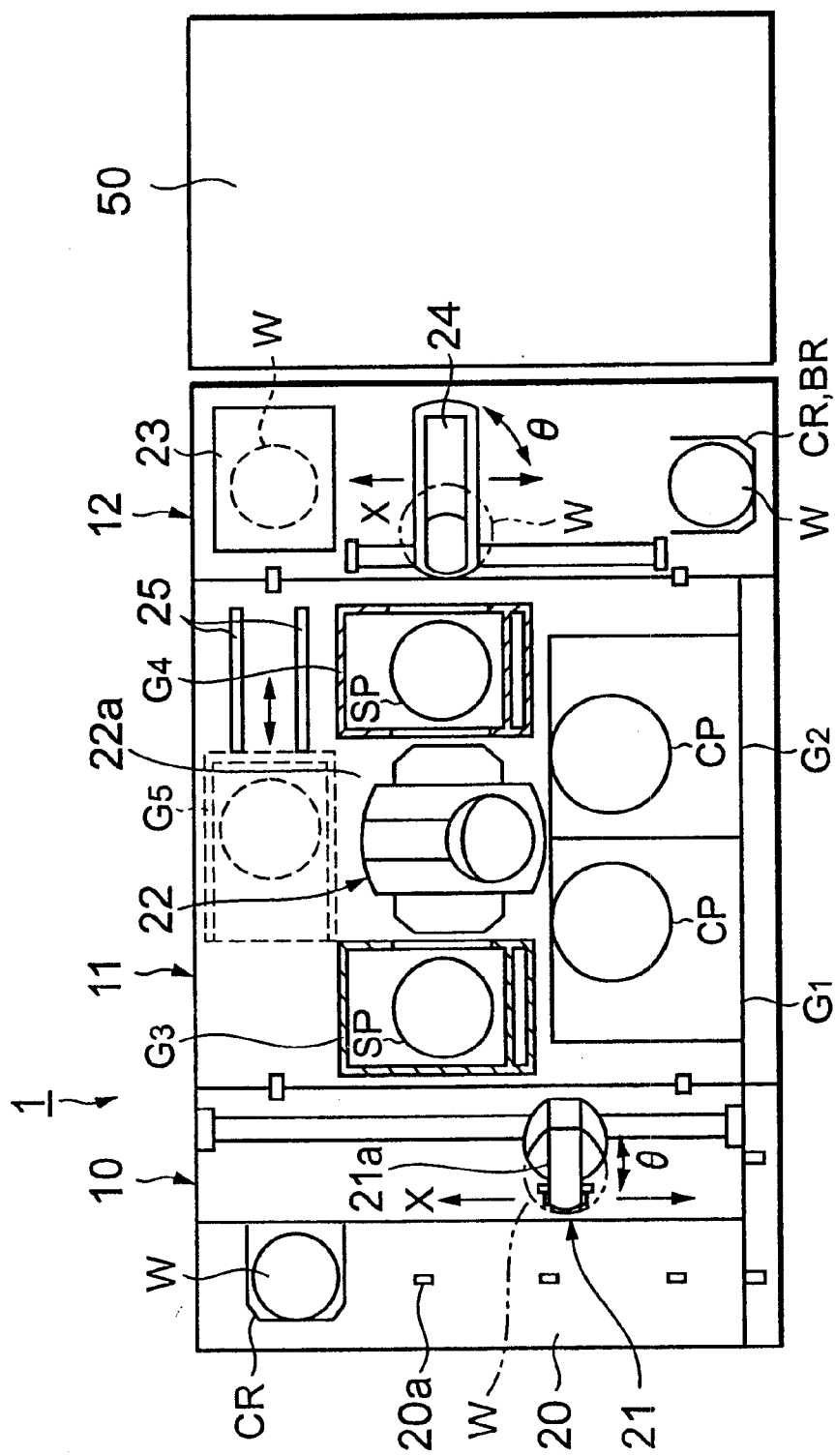
FIG. 1 is a plane view showing the whole structure of a coating and developing processing system for a semiconductor wafer according to an embodiment of the present invention.
Figure 2:
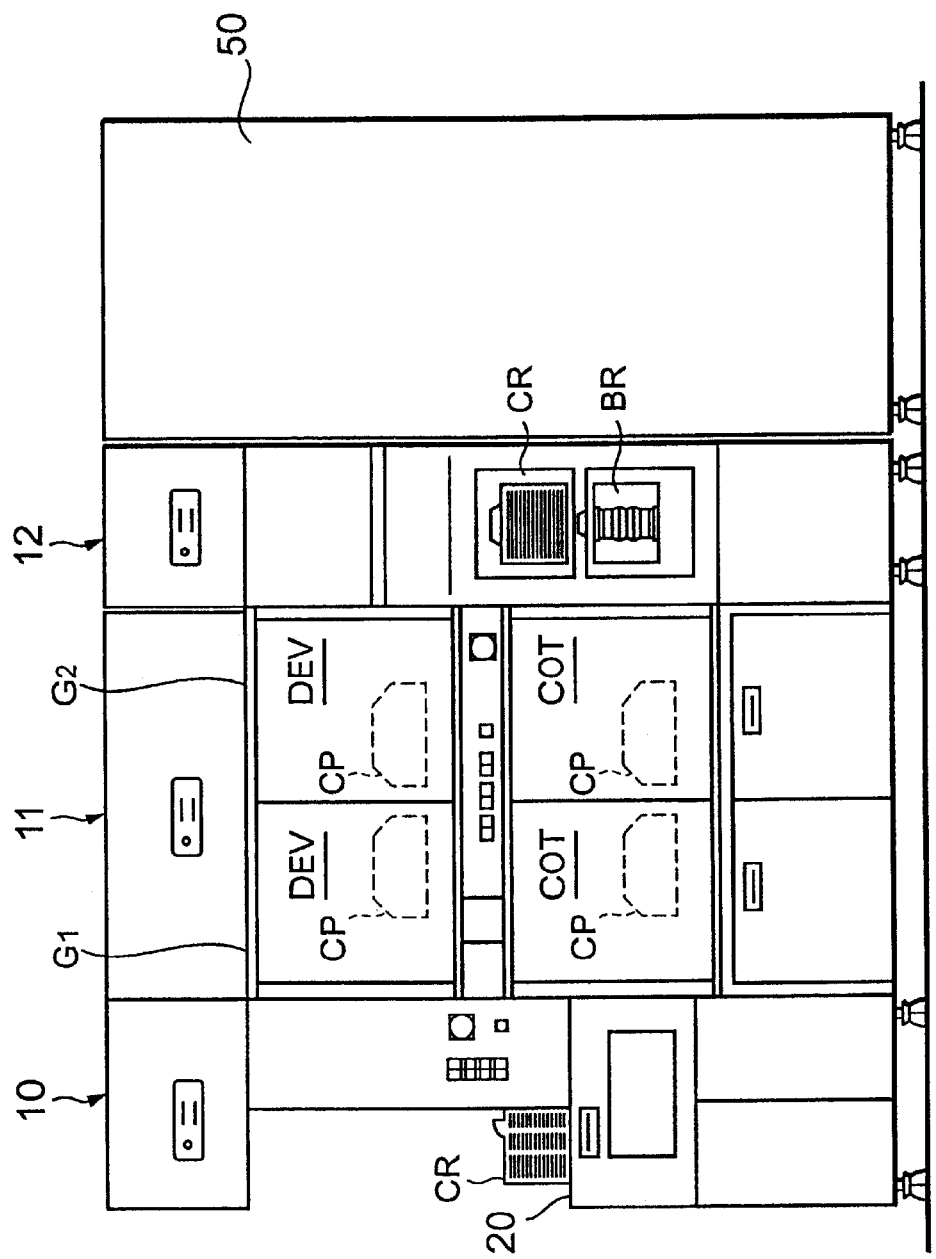
FIG. 2 is a front view of the coating and developing processing system shown in FIG. 1.
Figure 3:
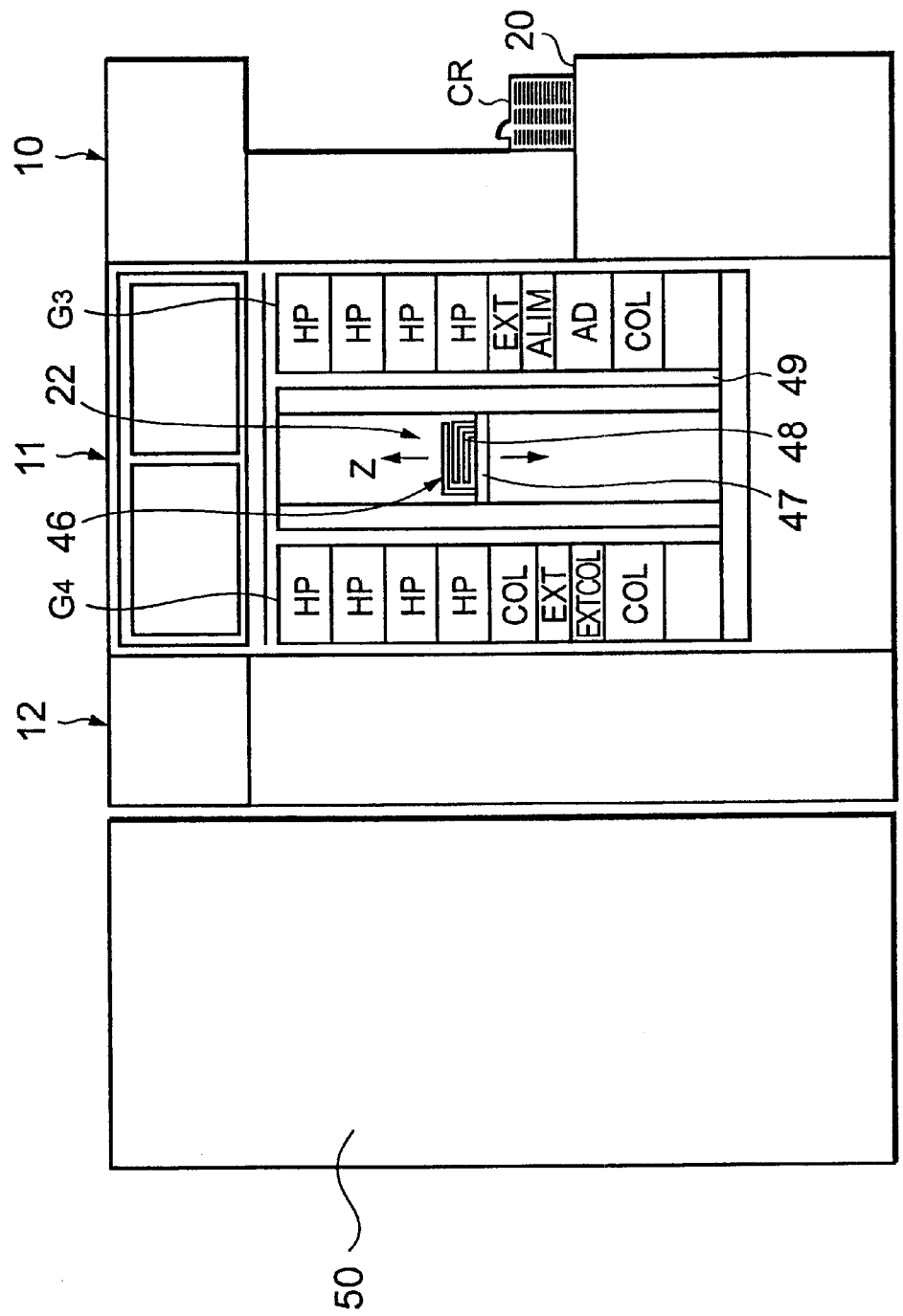
FIG. 3 is a rear view of the coating and developing processing system shown in FIG. 1.

FIG. 1 is a schematic plane view showing a resist coating and developing processing system according to an embodiment of the present invention, FIG. 2 is a front view thereof, and FIG. 3 is a rear view thereof.

The resist coating and developing processing system 1 comprises a cassette station 10 as a transfer station, a processing station 11 including a plurality of processing units, and an interface section 12 for delivering a wafer W to/from an aligner 50 provided adjacent to the processing station 11.

The aforesaid cassette station 10 has functions of carrying a plurality of, for example, 25 semiconductor wafers W (hereinafter referred to as only wafers) as objects to be processed, as a unit, housed in a wafer cassette CR from another system into this system or from this system into another system, and transferring the wafer W between the wafer cassette CR and the processing station 11.

In this cassette station 10, as shown in FIG. 1, a plurality of (four in FIG. 1) positioning projections 20a are formed on a wafer cassette mounting table 20 along an X-direction in FIG. 1 and the wafer cassettes CR can be mounted in a line with respective wafer transfer ports facing the processing station 11 side at positions of the projections 20a. In the wafer cassette CR, the wafers W are arranged in a vertical direction (a Z-direction). Moreover, the cassette station 10 includes a wafer transfer mechanism 21 positioned between the wafer cassette mounting table 20 and the processing station 11. The wafer transfer mechanism 21 includes a wafer transfer arm 21a movable in the direction of arrangement of the cassettes (the X-direction) and in the direction of arrangement of the wafers W housed in the wafer cassette CR (the Z-direction) and can selectively get access to any of the wafer cassettes CR by the wafer transfer arm 21a. The wafer transfer arm 21a is also structured to be rotatable in a θ-direction so as to be also accessible to an alignment unit (ALIM) and an extension unit (EXT) included in a third processing unit group $G_3$ on the processing station 11 side as will be described later.

The processing station 11 includes a plurality of processing units for carrying out a series of processes when coating and development are performed for the wafer W. These units are multi-tiered at predetermined positions, and the wafers W are processed one by one by these units. As shown in FIG. 1, the processing station 11 has a transfer path 22a in the middle thereof in which a main wafer transfer mechanism 22 is provided, and all the processing units are arranged around the wafer transfer path 22a. The plurality of processing units are divided into a plurality of processing unit groups, and a plurality of processing units are multi-tiered along the vertical direction in each processing unit group.

As shown in FIG. 3, the main wafer transfer mechanism 22 includes a wafer transfer device 46 which is ascendable and descendable in the vertical direction (the Z-direction) within a cylindrical supporter 49. The cylindrical supporter 49 can rotate by rotational driving force of a motor (not shown), and also the wafer transfer device 46 can be integrally rotated with the cylindrical supporter 49.

The wafer transfer device 46 includes a plurality of holding members 48 which are movable in a forward and rearward direction of a transfer base 47. The use of the holding members 48 realizes delivery of the wafer W between the processing units.

As shown in FIG. 1, four processing unit groups $G_1$, $G_2$, $G_3$. and $G_4$ are actually arranged around the wafer transfer path 22a in this embodiment and a processing unit group $G_5$ can be disposed as required.

Out of these, the first and second processing unit groups $G_1$ and $G_2$ are arranged in a raw on the front side of the system (on the lower side in FIG. 1), the third processing unit group $G_3$ is arranged adjacent to the cassette station 10, and the fourth processing unit group $G_4$ is arranged adjacent to the interface section 12. Moreover, the fifth processing unit group $G_5$. can be arranged on the rear side.

In the above case, as shown in FIG. 2, in the first processing unit group $G_1$, two spinner-type processing units in which the wafer W is mounted on a spin chuck (not illustrated) inside a cup CP to undergo predetermined processing are vertically two-tiered. In this embodiment, a resist coating unit (COT) for applying a resist onto the wafer W and a developing unit (DEV) for developing a pattern of the resist are two-tiered from the bottom in order. Similarly in the second processing unit group $G_2$, a resist coating unit (COT) and a developing unit (DEV) as two spinner-type processing units are two-tiered from the bottom in order.

The reason why the resist coating unit (COT) and the like are disposed on the lower tier side is that drainage of a resist solution is essentially more complex in terms of both mechanism and maintenance than that of a developing solution, and that the complexity is mitigated by disposing the resist coating unit (COT) and the like on the lower tier as described above. It is possible, however, to arrange the resist coating unit (COT) and the like on the upper tier as required.

As shown in FIG. 3, in the third processing unit group $G_3$, oven-type processing units in each of which the wafer W is placed on a mounting table SP to undergo predetermined processing are multi-tiered. More specifically, a cooling unit (COL) for performing cooling processing, an adhesion unit (AD) for performing so-called hydrophobic processing to enhance fixedness of the resist, an alignment unit (ALIM) for performing alignment, an extension unit (EXT) for carrying the wafer W in and out, and four hot plate units (HP) for performing heat processing for the wafer W before and after exposure processing and after developing processing are eight-tiered from the bottom in order. It is suitable to provide a cooling unit (COL) in place of the alignment unit (ALIM) and the cooling unit (COL) may be given an alignment function.

Also in the fourth processing unit group $G_4$, oven-type processing units are multi-tiered. More specifically, a cooling unit (COL), an extension and cooling unit (EXTCOL) which is a wafer carrying in/out section provided with a cooling plate, an extension unit (EXT), a cooling unit (COL), and four hot plate units (HP) are eight-tiered from the bottom in order.

The above arrangement of the cooling unit (COL) and the extension and cooling unit (EXTCOL) having low processing temperature at the lower tiers and the hot plate units (HP) having high processing temperature at the upper tiers can reduce thermal mutual interference between units. Random multi-tiered arrangement is naturally suitable.

As described above, the fifth processing unit group $G_5$ can be provided on the rear side of the main wafer transfer mechanism 22. In the case where the fifth processing unit group $G_5$, is provided, it can be moved along guide rails 25 laterally as seen from the main wafer transfer mechanism 22. Accordingly, even in the case where the fifth processing unit group $G_5$, is provided, a space portion is obtained by sliding the fifth processing unit group G, along the guide rails 25, so that maintenance operation for the main wafer transfer mechanism 22 can be easily performed from the back thereof. For the operation, a space can be similarly secured not only by moving the fifth processing unit group $G_5$ linearly, but also by turning it. Incidentally, one processing unit group having a structure basically the same as the third and fourth processing unit groups $G_3$ and $G_4$ in which oven-type processing units are multi-tiered can be used as the fifth processing unit group $G_5$.

The aforesaid interface section 12 has the same length as the processing station 11 in a depth direction (the X-direction). As shown in FIG. 1 and FIG. 2, a transportable pickup cassette CR and a fixed-type buffer cassette BR are two-tiered at the front of the interface section 12, a peripheral aligner 23 is disposed at the rear, and a wafer transfer body 24 is disposed at the center. The wafer transfer body 24 moves in the X-direction and the Z-direction to be accessible to both the cassettes CR and BR, and the peripheral aligner 23. Moreover, the wafer transfer body 24 is rotatable in the θ-direction to be accessible to the extension unit (EXT) included in the fourth processing unit group $G_4$ of the processing station 11 and also to a wafer delivery table (not shown) on the adjacent aligner side.

In the resist coating and developing processing system 1 structured as above, the wafer transfer arm 21a of the wafer transfer mechanism 21 first gets access to the wafer cassette CR housing unprocessed wafers W on the cassette mounting table 20 and takes one wafer W out of the cassette CR in the cassette station 10 and transfers the wafer W to the extension unit (EXT) included in the third processing unit group $G_3$.

The wafer W is transferred from the extension unit (EXT) into the processing station 11 by means of the wafer transfer device 46 of the main wafer transfer mechanism 22. Then, the wafer W undergoes alignment in the alignment unit (ALIM) included in the third processing unit group $G_3$ and thereafter is transferred to the adhesion unit (AD) to undergo hydrophobic processing (HMDS processing) for enhancing fixedness of the resist there. Since this processing is attended with heating, the wafer W is then transferred to the cooling unit (COL) by the wafer transfer device 46 and cooled.

The wafer W which has been cooled in the cooling unit (COL) after the completion of the adhesion processing is sequentially transferred to the resist coating unit (COT) by the wafer transfer device 46, where a coating film is formed. After the completion of the coating processing, the wafer W undergoes prebake processing in any one of the hot plate units (HP) of the processing unit groups $G_3$ and $G_4$ and is cooled in any one of the cooling units (COL).

The cooled wafer W is transferred to the alignment unit (ALIM) of the third processing unit group $G_3$ and aligned there, and thereafter the wafer W is transferred to the interface section 12 via the extension unit (EXT) of the fourth processing unit group $G_4$.

In the interface section 12, peripheral exposure is performed by the peripheral aligner 23 to remove an excess resist, and the wafer W is transferred to the aligner 50 provided adjacent to the interface section 12, where the resist film of the wafer W undergoes exposure processing in accordance with a predetermined pattern.

The wafer W after exposure is returned to the interface section 12 and transferred to the extension unit (EXT) included in the fourth processing unit group $G_4$ by the wafer transfer body 24. The wafer W is transferred to any one of the hot plate units (HP) by the wafer transfer device 46 to undergo post-exposure bake processing and then cooled by the cooling unit (COL).

Then, the wafer W is transferred to the developing unit (DEV), where development of the exposed pattern is performed. After the completion of the development, the wafer W is transferred to any one of the hot plate units (HP) to undergo postbake processing and then cooled by the cooling unit (COL). After the completion of such a series of processes, the wafer W is returned to the cassette station 10 via the extension unit (EXT) of the third processing unit group $G_3$ and housed in any of the wafer cassettes CR.

Figure 4:
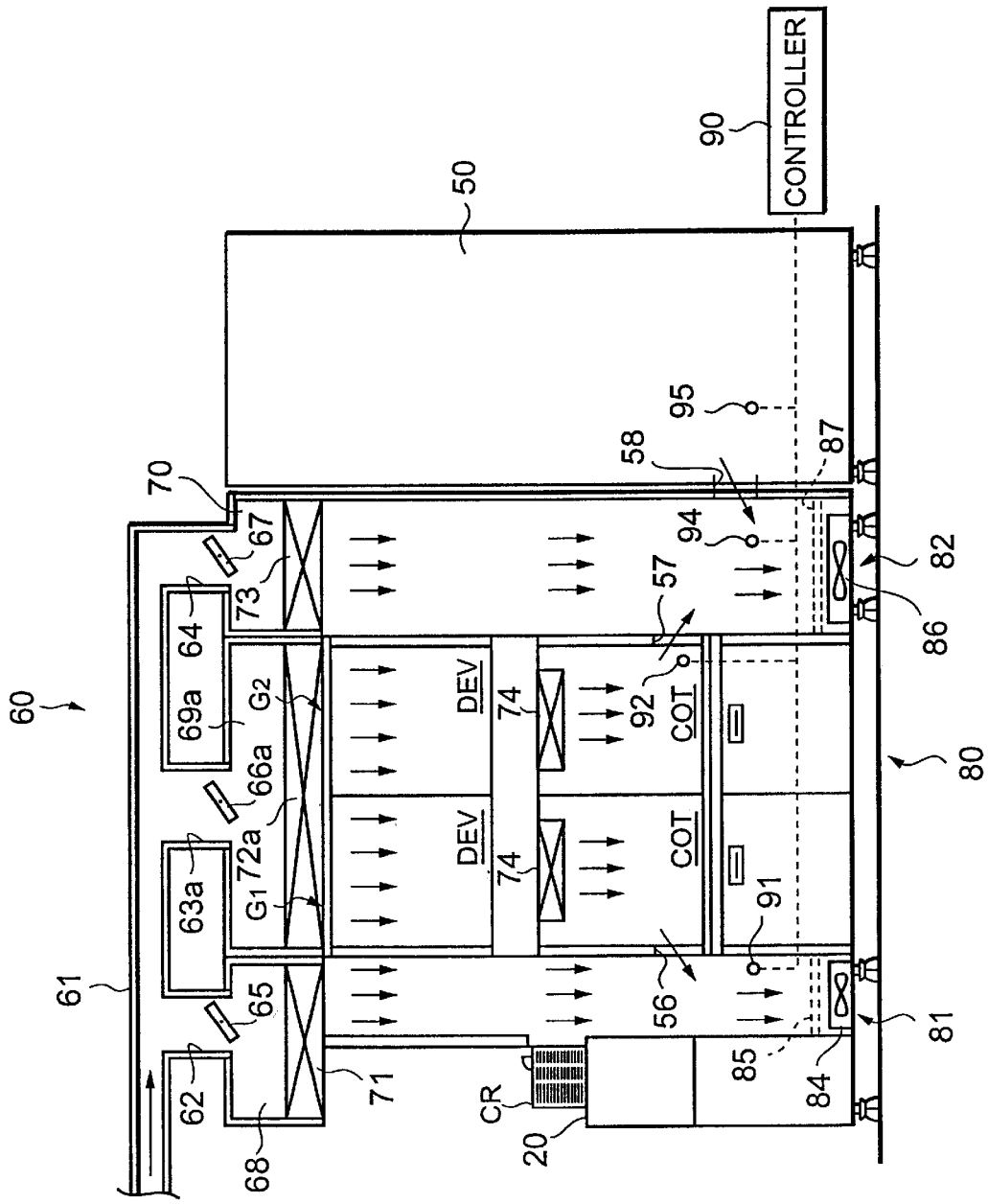
FIG. 4 is a view for explaining a state of airflow on the front side of the coating and developing processing system according to this embodiment.

Next, an airflow forming mechanism in the resist coating and developing processing system according to this embodiment will be explained with reference to FIG. 4 to FIG. 6. FIG. 4 is a view for explaining a state of airflow on the front side of the coating and developing processing system according to this embodiment, FIG. 5 is a view for explaining a state of airflow on the rear side of the coating and developing processing system according to this embodiment, and FIG. 6 is a view for explaining a state of airflow in a rotary-system processing unit and a thermal-system processing unit in the processing station.

Figure 5:
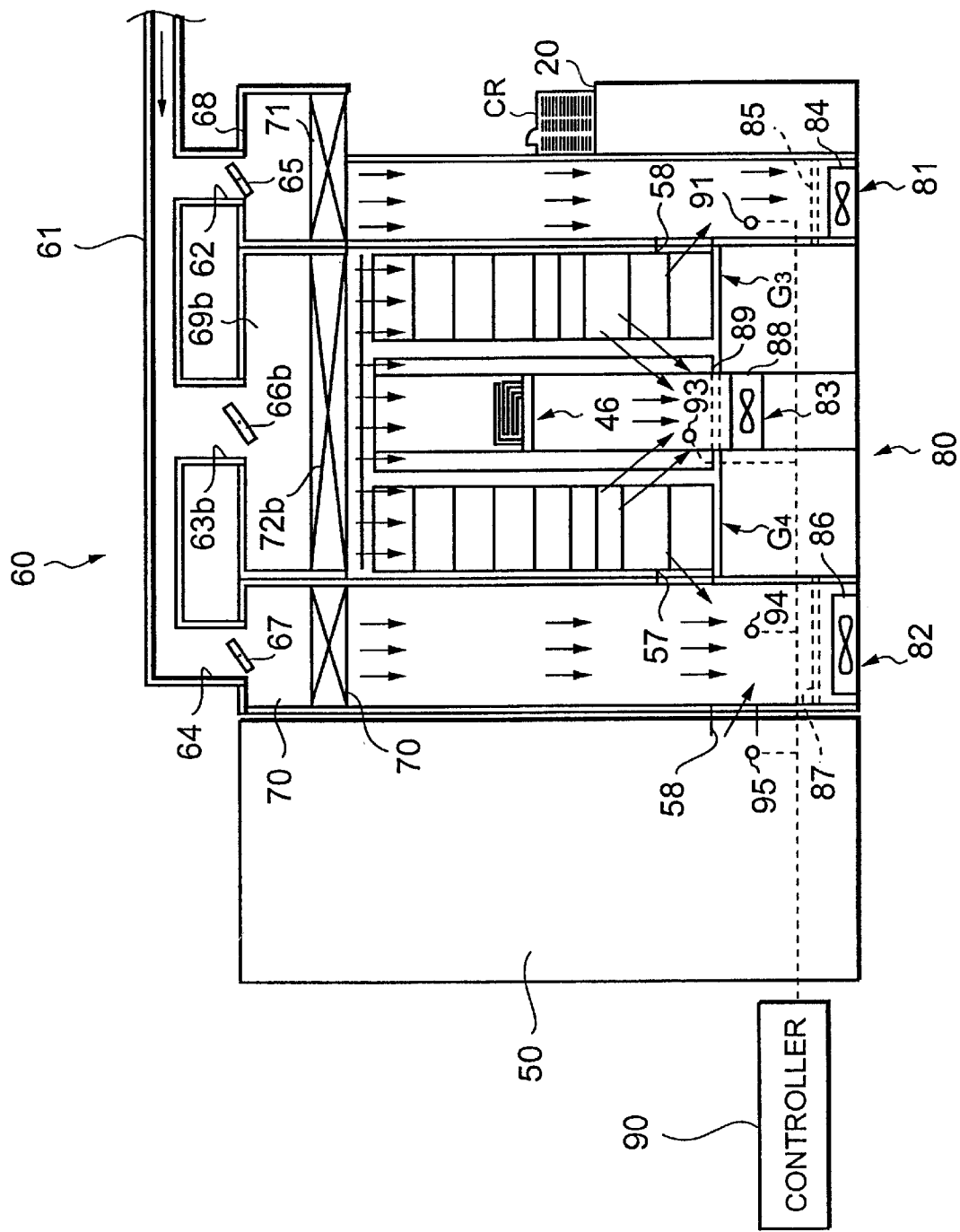
FIG. 5 is a view for explaining a state of airflow on the rear side of the coating and developing processing system according to this embodiment.
Figure 6:
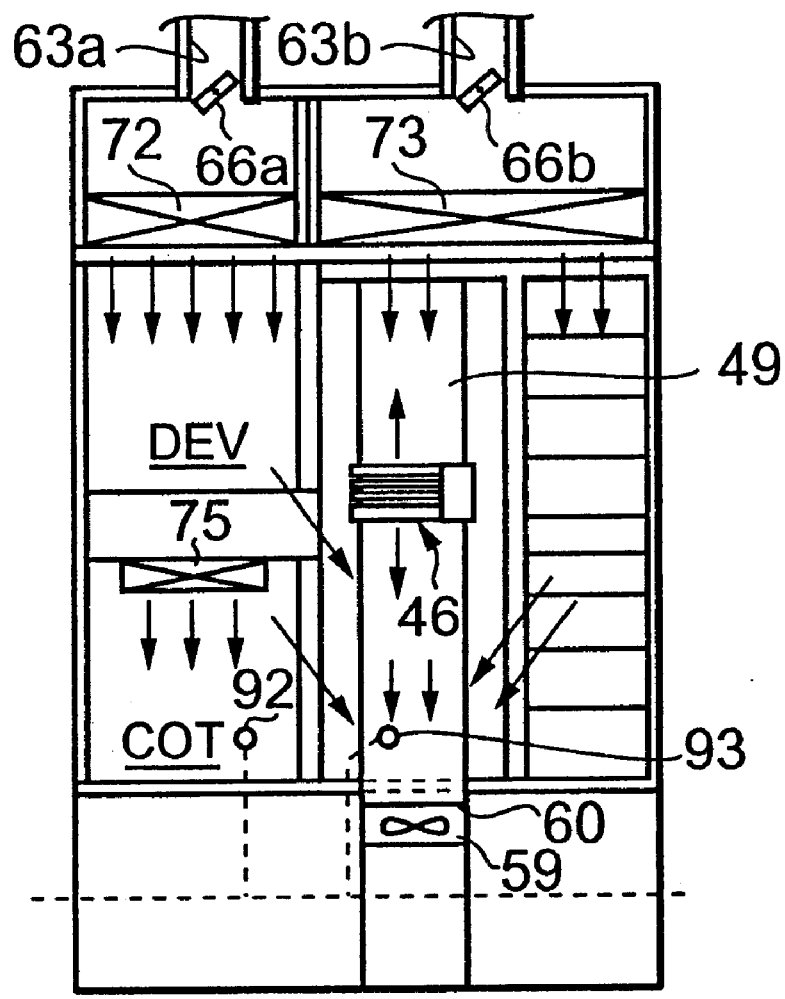
FIG. 6 is a view for explaining a state of airflow in a rotary-system processing unit and a thermal-system processing unit in a processing station.

As shown in FIG. 4 and FIG. 5, the airflow forming mechanism comprises an air supply mechanism 60 provided at the top of the resist coating and developing processing system 1 and an exhaust mechanism 80 provided at the bottom of the system 1.

The air supply mechanism 60 includes a duct 61 for introducing clean air from a supply source not illustrated into the system 1 and clean air in a down flow state is supplied from the duct 61 respectively; to the cassette station 10 through a supply pipe 62, an air supply chamber 68, and a filter 71; to the processing station 11 through supply pipes 63a and 63b, air supply chambers 69a and 69b, and filters 72a and 72b; and to the interface section 12 through a supply pipe 64, an air supply chamber 70, and a filter 73. In the supply pipes 62, 63a, 63b, and 64 respectively provided are dampers 65, 66a, 66b, and 67 for controlling the flow rate of air to be introduced.

In the processing station 11, clean air from the duct 61 is supplied to the processing unit groups $G_1$ and $G_2$ in each of which spinner-type units are stacked in tiers through the supply pipe 63a, the air supply chamber 69a, and the filter 72a. Clean air from the duct 61 is supplied to the transfer path 22a and the processing unit groups $G_3$ and $G_4$ in each of which oven-type units are stacked in tiers through the supply pipe 63b, the air supply chamber 69b, and the filter 72b. Moreover, filters 74 are provided at the tops of the coating processing units (COT) at the lower tiers of the processing unit groups $G_1$, and $G_2$ and down flows from the developing processing units (DEV) are supplied to the coating processing units (COT) through the filters 74.

The exhaust mechanism 80 comprises an exhaust unit 81 provided at the bottom of the cassette station 10, an exhaust unit 82 provided at the bottom of the interface section 12, and an exhaust unit 83 provided at the bottom of the transfer path 22a of the processing station 11. The exhaust unit 81 includes an exhaust fan 84 and a slit damper 85 provided above the exhaust fan 84. The exhaust unit 82 includes an exhaust fan 86 and a slit damper 87 provided above the exhaust fan 86. The exhaust unit 83 includes an exhaust fan 88 and a slit damper 89. Incidentally, in addition to the whole exhaust mechanism as described above, a unit exhaust mechanism not illustrated is provided in each processing unit. It should be noted that the clean air exhausted from the exhaust mechanism 80 is exhausted from an exhaust port which is provided at the floor of the clean room in which the resist coating and developing processing system 1 is placed to the outside of the clean room.

Moreover, the side walls of the processing station 11 are provided with draft openings 56 and 57 which communicate with the cassette station 10 and the interface section 12. Furthermore, the aligner 50 is provided with an opening portion 58 for delivering the wafer W.

Further, the resist coating and developing processing system 1 includes a controller 90 for controlling the pressure of the cassette station 10, the pressure of the processing station 11, and the pressure of the interface section 12 individually. To the controller 90 connected are a pressure sensor 91 provided in the cassette station 10, pressure sensors 92 and 93 provided in the processing station, a pressure sensor 94 provided in the interface section 12, and a pressure sensor 95 provided in the aligner 50. The controller 90 controls the pressures of the cassette station 10, the processing station 11, and the interface section 12 individually based on values of the pressure sensors 91 to 94.

The pressure of the cassette station 10 is controlled by adjusting the supplied amount of air through the control of the degree of opening of the damper 65 or by adjusting the exhausted amount of air through the control of the degree of opening of the slit damper 85 or the number of revolutions of the fan 84 based on the value of the pressure sensor 91. The pressure of the processing station 11 is controlled by adjusting the supplied amount of air through the control of the degrees of opening of the dampers 66a and 66b or by adjusting the exhausted amount of air through the control of the degree of opening of the slit damper 89 or the number of revolutions of the fan 88 based on the values of the pressure sensors 92 and 93. Concretely, in the processing station 11, the processing unit groups $G_1$, and $G_2$, and the transfer path 22a and the processing unit groups $G_3$ and $G_4$ are supplied with air separately as described above. The pressure of the processing unit groups $G_1$, and $G_2$ and the pressure of the transfer path 22a and the processing unit groups $G_3$ and $G_4$ are controlled separately by the controller 90 based on the detected value of the pressure sensor 92 provided at the coating processing unit (COT) and the detected value of the pressure sensor 93 provided at the transfer path 22a. Incidentally, the above pressure control may be performed by controlling two or more of the degree of opening of the damper, the degree of the slit damper, and the number of revolutions of the fan.

In the airflow forming mechanism structured as above, clean air is supplied into the cassette station 10, the processing station 11, and the interface section 12 from the supply source not illustrated of the air supply mechanism 60 through the duct 61 as described above and air is exhausted by the exhaust mechanism 80, thereby forming a down flow of clean air from the top toward the bottom in each of the above stations and section.

In this case, the degrees of opening of the dampers 65 to 67 of the air supply mechanism 60, the degrees of opening of the slit dampers 85, 87, and 89 of the exhaust mechanism 80, and the numbers of revolutions of the exhaust fans 84, 86, and 88 are controlled by the controller 90 based on the values of the pressure sensors 91 to 94 so that the pressure in the processing station 11 becomes higher within a predetermined range than the pressures in the cassette station 10 and the interface section 12, thereby forming flows of air from the processing station 11 into the cassette station 10 and the interface section 12 via the draft openings 56 and 57. Thereby, entry of air from the cassette station 10 and the interface section 12 into the processing station 11 can be prevented and entry of impurities such as particles, alkaline components and the like into the processing station 11, which loathes impurities and changes in atmosphere, for performing resist coating and developing processing and changes in atmosphere of the processing station 11 can be securely prevented, whereby a precise pattern can be obtained. Moreover, since the filters 71 to 73 are provided, entry of impurities into the resist coating and developing processing system 1 can be further securely prevented.

Adding the value of the pressure sensor 95 provided in the aligner 50, the pressure in the interface section 12 is controlled by the controller 90 to become lower than the pressure in the aligner 50 to thereby form a flow of air from the aligner 50 into the interface section 12 through the opening portion 58, whereby entry of air into the aligner 50 from which influence of temperature needs to be precluded in order to obtain a precise pattern can be prevented and a precise pattern can be obtained. Moreover, the pressures are controlled by the controller 90 so that the pressure in the processing station 11 becomes lower than the pressure in the aligner 50, thereby securely preventing entry of air from the processing station 11 into the aligner 50 which loathes entry of external atmosphere. Further, it is advantageous to provide the draft opening 57 from the processing station 11 to the interface section 12 at a position higher than the opening portion 58 of the aligner 50 as shown in FIG. 4 and FIG. 5 because the airflow control becomes easier to perform as the opening becomes closer to the fan. In other words, the opening portion 58 of the aligner 50 is provided closer to the exhaust fan 86, thereby preventing the formation of an airflow toward the aligner 50 side, and thus entry of particles into the aligner 50 side can be effectively prevented.

It should be noted that in the interface section 12, although air flows out in a slanting flow from the processing station 11 via the draft opening 57 and air flows out in a slanting flow also from the aligner 50 via the opening portion 58, the buffer cassette BR housing the wafers W is placed away from the slanting flows.

Moreover, in the processing station 11, as sown in FIG. 6, the pressure in the first and second processing unit groups $G_1$ and $G_2$ (spinner-type processing unit groups) is controlled by the controller 90 so as to become higher than the pressure in the third and fourth processing unit groups $G_3$ and $G_4$ (oven-type processing unit groups) and in the transfer path 22a. The air flows from the spinner-type processing unit groups $G_1$ and $G_2$ and the air flows from the oven-type processing unit groups $G_3$ and $G_4$ are exhausted by the exhaust unit 83 at the bottom of the transfer path 22a.

Thereby, entry of air from the transfer path 22a and the oven-type processing unit groups $G_3$ and $G_4$ into the coating processing units (COT) and the developing processing units (DEV) which need the most precise control in the processing station 11 can be prevented, and thus entry of impurities into the coating processing units (COT) and the developing processing units (DEV) and changes in atmosphere can be further securely prevented.

The pressures are controlled as above, thereby preventing entry of impurities into the coating processing units (COT), the developing processing units (DEV), and the aligner 50 which loathe impurities and changes in atmosphere, and changes in atmosphere in the above units and aligner to some extent. In terms of the above prevention with more certainty, it is preferable to manage at least one of temperature, humidity, contamination concentration, and concentration of alkaline components in each station and to take measures such as sounding an alarm or the like if one of those exceeds a predetermined value.

However, in the system, some portions need to be managed precisely in the above points and the other portions do not need management to a great degree, and thus it is efficient to manage only the portions in need of management with consideration of the fact. For instance, the management is performed as shown in the table in FIG. 7 described below.

More specifically, shown in FIG. 7, the temperature and humidity in the spinner-type processing unit groups $G_1$ and $G_2$ composed of the coating processing units (COT) and the developing processing units (DEV) which loathe impurities and changes in atmosphere in the processing station 11 are controlled to be predetermined values by a suitable control means. Moreover, since the aligner 50 is also greatly influenced by changes in atmosphere, the temperature and humidity therein are also controlled to be predetermined values by the suitable control means. The portion except for the processing unit groups $G_1$ and $G_2$ of the processing station 11, that is, the transfer path 22a and the oven-type processing unit groups $G_3$ and $G_4$ on the back side of the system are not much influenced by temperature and humidity, and thus management thereof is not performed and they are held at the temperature and humidity in the clean room. The temperature and humidity thereof may be controlled if necessary. The cassette station 10 and the interface section 12 are also not much influenced by temperature and humidity, and thus they are held at the temperature and humidity in the clean room. The temperature and humidity thereof may be managed if necessary.

Further, contamination needs to be decreased in all the portions of the resist coating and developing processing system 1 and the aligner 50, and hence it is managed to become a predetermined value or less in all the portions. More specifically, the value of contamination is measured by a particle counter or the like at predetermined timing and when the value exceeds a predetermined value, the contamination is handled separately.

Furthermore, since ammonia which is a representative alkaline component adversely affects on processing, the concentration thereof is managed to become, for example, 1 ppb or less in the processing station 11, the interface section 12, and the aligner 50. Concretely, the ammonia concentration is analyzed by an analyzer at predetermined timing and when the concentration exceeds 1 ppb, measures such as exchange of filters and the like are taken. Ammonia has little adverse effect on the cassette station, and thus the cassette station is not managed at all.

Next, another embodiment of the present invention will be described.

Figure 8:
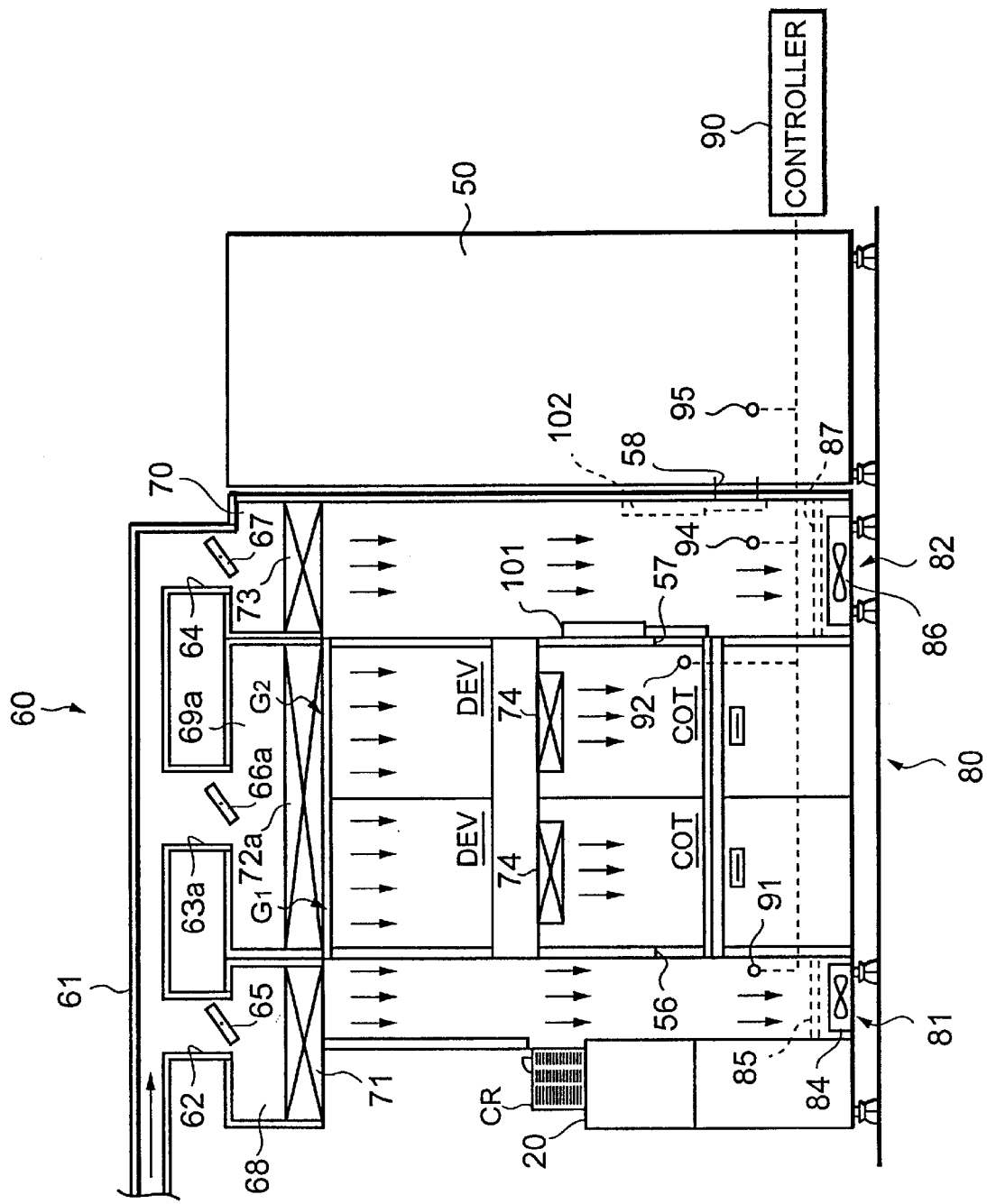
FIG. 8 is a schematic front view of the coating and developing processing system for a semiconductor wafer according to another embodiment of the present invention.

In the resist coating and developing processing system of this embodiment, as shown in FIG. 8, a shutter mechanism 101 capable of opening and closing the draft opening 57 is provided at the draft opening 57 between the processing station 11 and the interface section 12. The opening and closing of the shutter mechanism 101 is controlled by the controller 90.

Figure 9:
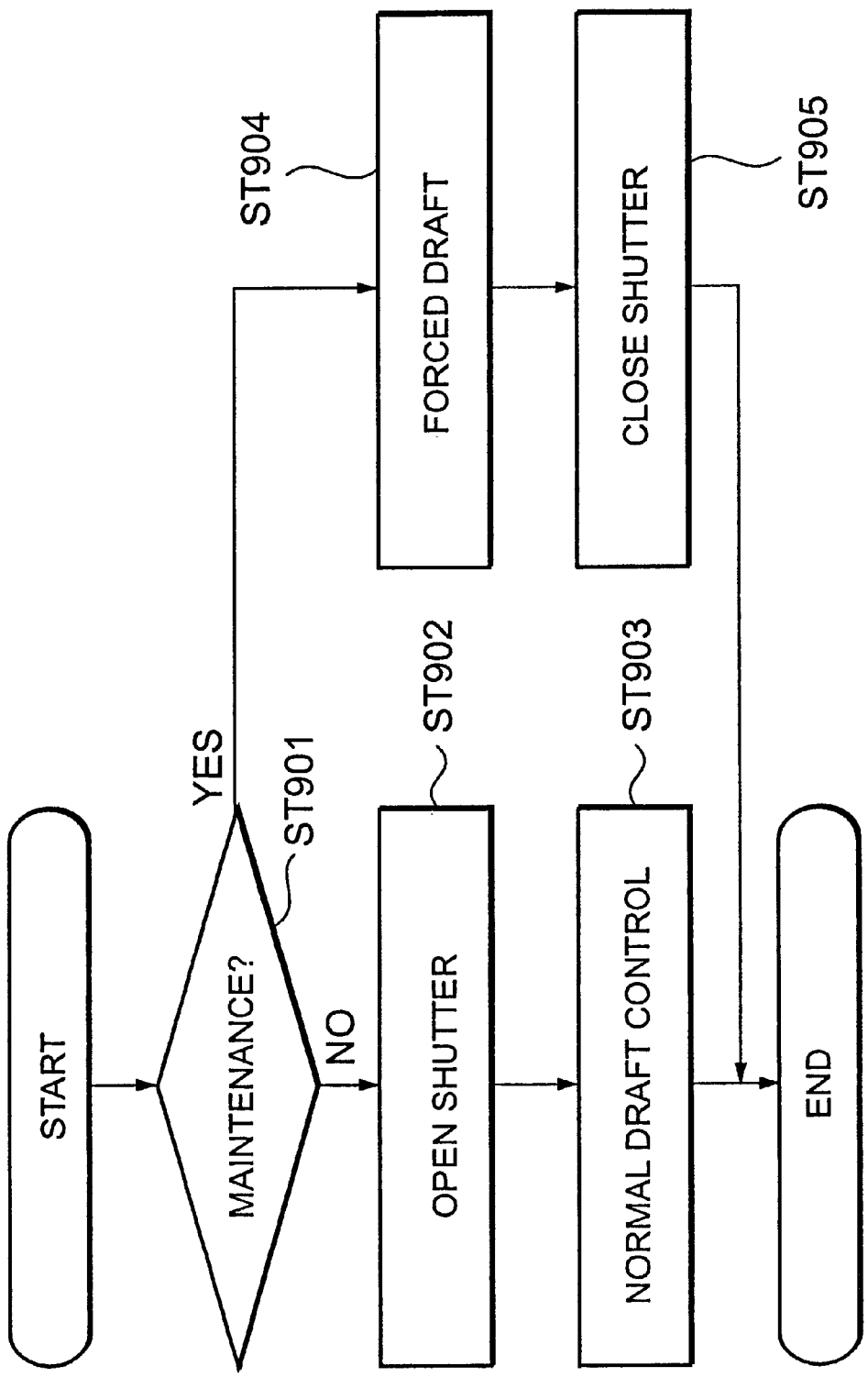
FIG. 9 is a flowchart for explaining operations in the system shown in FIG. 8.

As shown in FIG. 9, in a normal state where the resist coating and developing processing system processes the wafer W, a normal draft control, that is, a pressure control as in the aforesaid embodiment is performed (step 903) in a state where the draft opening 57 is opened by the shutter mechanism 101 (step 902). However, during maintenance of the cassette station 10 (step 901), for example, air supplied from the air supply mechanism 60 at the tops of the cassette station 10 and the processing station 11 comes to be supplied forcibly and strongly (step 904) and the draft opening 57 is brought into a closed state by the shutter mechanism 101 (step 905).

In this embodiment, through the performance of such a control, particles and the like which have formed in the cassette station 10 during maintenance are exhausted forcibly to the outside of the system. Accordingly, particles and the like which have formed in the cassette station 10 are prevented from reaching to the processing station 11 side and further to the aligner 50 side through the interface section 12.

Incidentally, as for realization of the state of maintenance, for example, the operator may input the fact into the controller side, and alternatively it may be made, for example, based on opening and closing of a door (not shown) for maintenance provided at the cassette station 10.

Moreover, not only during maintenance, but also, for example, when the system is merely suspended, the same control may be performed.

Incidentally, the present invention is not limited to the aforesaid embodiments and can be modified variously. For example, the resist coating and developing processing system for a semiconductor wafer has been described in the aforesaid embodiments, but the present invention can be applied to a resist coating and developing processing system for another substrate to be processed such as an LCD substrate, except for a semiconductor wafer.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A resist coating and developing processing apparatus, comprising:
   a processing section in which a plurality of processing units for performing various kinds of processing for resist-coating and developing processing for a substrate are disposed;
   a carrying in/out section, including a mounting portion capable of mounting a substrate housing container for housing a plurality of substrates thereon, for carrying the substrate from the substrate housing container into the processing section and for housing the substrate carried out of the processing section in the substrate housing container;

an interface section for receiving the substrate from the processing section and passing it to an aligner and for receiving the substrate after exposure from the aligner and passing it to the processing section;

airflow forming means for forming flows of air from the tops of the carrying in/out section, processing section, and interface section toward the bottoms; and control means for controlling the airflow forming means, said processing section including a first and second draft opening communicating with the carrying in/out section and the interface section respectively, and said control means controlling the airflow forming means so that the pressure in the processing section becomes higher than the pressures in the carrying in/out section and in the interface section to form flows of air from the processing section into the carrying in/out section and the interface section;

wherein said interface section includes a communicating opening communicating with the aligner, and wherein said control means controls said airflow forming means so that the pressure in said interface section becomes lower than the pressure in the aligner to form a flow of air from the aligner into said interface section.

2. The apparatus as set forth in claim 1, wherein said control means controls said airflow forming means so that the pressure in said processing section becomes lower than the pressure in the aligner.

3. The apparatus as set forth in claim 1, wherein the second draft opening of said processing section communicating with said interface section is provided at a position higher than the communicating opening of said interface section communicating with the aligner.

4. The apparatus as set forth in claim 1, wherein said airflow forming means includes an air supply mechanism for supplying air from the respective tops of said carrying in/out section, processing section, and interface section and an exhaust mechanism for exhausting air from the respective bottoms, and wherein said control means controls the air supply mechanism and/or the exhaust mechanism to control the pressures of said carrying in/out section, processing section, and interface section.

5. The apparatus as set forth in claim 4, wherein the air supply mechanism includes dampers provided at air introducing ports at the respective tops of said carrying in/out section, processing section, and interface section, and wherein said control means controls the degrees of opening of the dampers to control the pressures of said carrying in/out section, processing section, and interface section.

6. The apparatus as set forth in claim 4, wherein the exhaust mechanism includes slit dampers provided at the respective bottoms of said carrying in/out section, processing section, and interface section and exhaust fans provided under the slit dampers, and wherein said control means controls the degrees of opening of the slit dampers and/or the numbers of revolutions of the exhaust fans to control the pressures of said carrying in/out section, processing section, and interface section.

7. The apparatus as set forth in claim 4, wherein said processing section further includes a transfer path and a transfer apparatus, moving in the transfer path, for transferring the substrate to the plurality of processing units, and wherein the exhaust mechanism exhausts air downward from the bottom of the transfer path.

8. The apparatus as set forth in claim 7, wherein said processing section includes a thermal-system processing unit group composed of a plurality of thermal-system processing units for performing thermal processing for the substrate stacked in tiers and a rotary-system processing unit group composed of coating processing units and/or developing processing units for performing processing while the substrate is rotated stacked in tiers, wherein the air supply mechanism supplies air to the rotary-system processing unit group, and the thermal-system processing unit group and the transfer path separately, and wherein said control means controls the air supply mechanism so that the pressure in the rotary-system processing unit group becomes higher than the pressure in the transfer path and the thermal-system processing unit group.

9. The apparatus as set forth in claim 1, further comprising:

pressure sensors for detecting the respective pressures of said carrying in/out section, processing section, and interface section, wherein said control means controls the pressures of said carrying in/out section, processing section, and interface section based on detected values of the pressure sensors.

10. The apparatus as set forth in claim 1, further comprising:

filters provided respectively at air introducing portions of said carrying in/out section, processing section, and interface section, for cleaning air.

11. The apparatus as set forth in claim 1, further comprising:

means for managing temperature, or temperature and humidity of air of said processing section.

12. The apparatus as set forth in claim 1, further comprising:

means for managing concentrations of air contamination of said carrying in/out section, processing section, and interface section.

13. The apparatus as set forth in claim 1, further comprising:

means for managing ammonia concentrations of air of said processing section and interface section.

14. A resist coating and developing processing apparatus, comprising:

a processing section in which a plurality of processing units for performing various kinds of processing for resist-coating and developing processing for a substrate are disposed;

a carrying in/out section, including a mounting portion capable of mounting a substrate housing container for housing a plurality of substrates thereon, for carrying the substrate from the substrate housing container into the processing section and for housing the substrate carried out of the processing section in the substrate housing container;

an interface section for receiving the substrate from the processing section and passing it to an aligner and for receiving the substrate after exposure from the aligner and passing it to the processing section;

airflow forming means for forming flows of air from the tops of the carrying in/out section, processing section, and interface section toward the bottoms; and control means for controlling the airflow forming means, said processing section including a first and second draft opening communicating with the carrying in/out section and the interface section respectively, and said control means controlling the airflow forming means to form flows of air with a strength not more than a first strength from the tops of said carrying in/out section, processing section, and interface section toward the bottoms when said resist coating and developing processing apparatus is processing the substrate, and to form flows of air with at least one of a second strength which exceeds the first strength and a third strength from the tops of said carrying in/out section and processing section toward the bottoms when the substrate processing apparatus is not processing the substrate;

wherein said interface section includes a communicating opening communicating with the aligner, and wherein said control means controls said airflow forming means so that the pressure in said interface section becomes lower than the pressure in the aligner to form a flow of air from the aligner into said interface section.

15. The apparatus as set forth in claim 14, wherein when the substrate processing apparatus is not processing the substrate is the time when maintenance of said resist coating and developing processing apparatus is performed.

16. The apparatus as set forth in claim 14, further comprising:

a first shutter mechanism capable of opening and closing the second draft opening and the opening and closing is controlled by said control means, wherein said control means controls the first shutter mechanism so that the second draft opening is opened when said resist coating and developing processing apparatus is processing the substrate and controls the first shutter mechanism so that the second draft opening is closed when the substrate processing apparatus is not processing the substrate.

17. The apparatus as set forth in claim 14, wherein said interface section includes a communicating opening communicating with the aligner, said apparatus further comprises a second shutter mechanism capable of opening and closing the communicating opening and the opening and closing is controlled by said control means, and wherein said control means controls the second shutter mechanism so that the communicating opening is opened when said resist coating and developing processing apparatus is processing the substrate and controls the second shutter mechanism so that the communicating opening is closed when the substrate processing apparatus is not processing, the substrate.

18. The apparatus as set forth in claim 17, wherein said control means controls said airflow forming means so that the pressure in said interface section becomes lower than the pressure in the aligner to form a flow of air from the aligner into said interface section when said resist coating and developing processing apparatus is processing the substrate.

19. The apparatus as set forth in claim 14, wherein said control means controls said airflow forming means so that the pressure in said processing section becomes higher than the pressures in said carrying in/out section and in said interface section to form flow of air from said processing section into said carrying in/out section and said interface section when is resist coating and developing processing apparatus is processing the substrate.

* * * * *